(12) United States Patent
Kitagawa

(10) Patent No.: US 11,705,302 B2
(45) Date of Patent: Jul. 18, 2023

(54) SUBSTRATE SUPPORT AND PLASMA PROCESSING APPARATUS

(71) Applicant: Tokyo Electron Limited, Tokyo (JP)

(72) Inventor: Dai Kitagawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 238 days.

(21) Appl. No.: 17/023,939

(22) Filed: Sep. 17, 2020

(65) Prior Publication Data
US 2021/0098224 A1    Apr. 1, 2021

(30) Foreign Application Priority Data
Oct. 1, 2019   (JP) .................. 2019-181483

(51) Int. Cl.
*H01J 37/20* (2006.01)
*B23Q 3/15* (2006.01)

(52) U.S. Cl.
CPC ............ *H01J 37/20* (2013.01); *B23Q 3/15* (2013.01); *H01J 2237/002* (2013.01)

(58) Field of Classification Search
CPC ...... H01J 37/20; H01J 2237/002; B23Q 3/15; H01L 21/6833
See application file for complete search history.

(56) References Cited

U.S. PATENT DOCUMENTS

2016/0217980 A1* 7/2016 Nakatani ............. H01L 21/3065
2019/0267218 A1* 8/2019 Wang ................ H01L 21/67109

FOREIGN PATENT DOCUMENTS

| JP | 3155802 U | 12/2009 |
| JP | 2013-172013 A | 9/2013 |
| JP | 2016-189425 A | 11/2016 |
| JP | 2017-224710 A | 12/2017 |

* cited by examiner

*Primary Examiner* — Scott Bauer
(74) *Attorney, Agent, or Firm* — Studebaker & Brackett PC

(57) ABSTRACT

A disclosed substrate support includes a base and first and second supports. A refrigerant flow path is formed inside the base. The base has first to third regions. The first region has a circular upper surface. The second region surrounds the first region. The third region surrounds the second region. The upper surface of the first region, the upper surface of the second region, and the upper surface of the third region are flat and continuous. The first support is provided on the first region and is configured to support the substrate placed thereon. The second support is provided on the third region to surround the first support, is configured to support the edge ring placed thereon, and is separated from the first support.

12 Claims, 4 Drawing Sheets

SUBSTRATE SUPPORT AND PLASMA PROCESSING APPARATUS

CROSS-REFERENCE TO RELATED APPLICATIONS

This application is based on and claims the benefit of priority from Japanese Patent Application No. 2019-181483 filed on Oct. 1, 2019, the entire contents of which are incorporated herein by reference.

FIELD

Exemplary embodiments of the present disclosure relate to a substrate support and a plasma processing apparatus.

BACKGROUND

A plasma processing apparatus is used for plasma processing on a substrate. The plasma processing apparatus includes a chamber and a placement table. The placement table has a base and an electrostatic chuck. A refrigerant flow path is formed in the base. The electrostatic chuck is mounted on the base. An edge ring is mounted on an outer peripheral portion of the electrostatic chuck. Further, a substrate is disposed on a central region of the electrostatic chuck and in a region surrounded by the edge ring. Japanese Patent Application Laid-Open Publication No. 2013-172013 discloses such a plasma processing apparatus.

SUMMARY

In one exemplary embodiment, a substrate support is provided. The substrate support includes a base, a first support, and a second support. A refrigerant flow path is formed inside the base. The base has a first region, a second region, and a third region. The first region has a circular upper surface. The second region extends outward in the radial direction with respect to the first region and surrounds the first region. The third region extends outward in the radial direction with respect to the second region and surrounds the second region. The upper surface of the first region, the upper surface of the second region, and the upper surface of the third region are flat and continuous. The first support is provided on the first region and is configured to support the substrate placed thereon. The second support is provided on the third region to surround the first support, is configured to support the edge ring placed thereon, and is separated from the first support.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
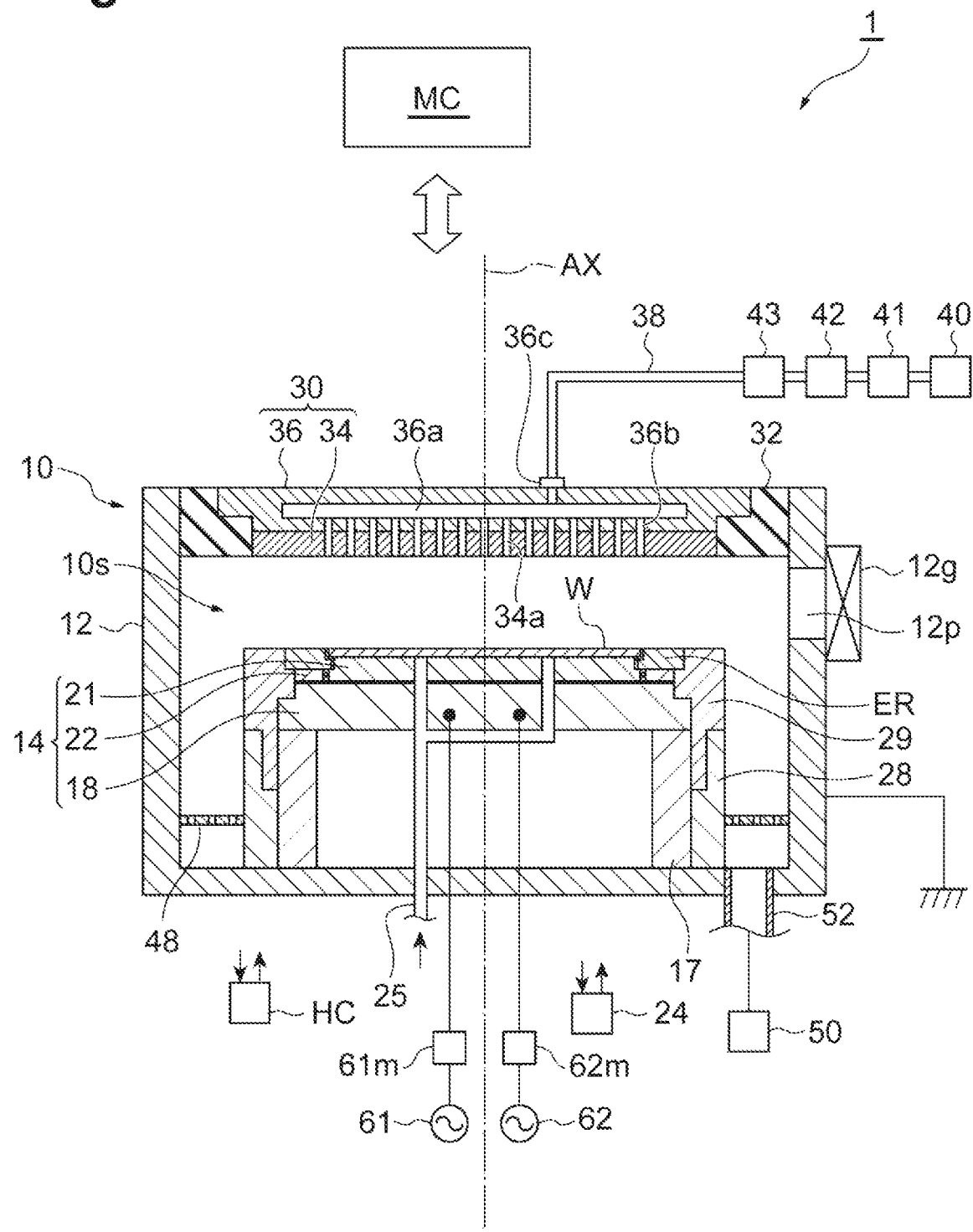
FIG. 1 is a diagram schematically illustrating a plasma processing apparatus according to one exemplary embodiment.

Hereinafter, various exemplary embodiments will lie described.

In one exemplary embodiment, a substrate support is provided. The substrate support includes a base, a first support, and a second support. A refrigerant flow path is formed inside the base. The base has a first region, a second region, and a third region. The first region has a circular upper surface. The second region extends outward in the radial direction with respect to the first region and surrounds the first region. The third region extends outward in the radial direction with respect to the second region and surrounds the second region. The upper surface of the first region, the upper surface of the second region, and the upper surface of the third region are flat and continuous. The first support is provided on the first region and is configured to support the substrate placed thereon. The second support is provided on the third region to surround the first support, is configured to support the edge ring placed thereon, and is separated from the first support.

In the substrate support of the above-described embodiment, the first support and the second support are separated from each other, so that heat conduction between the first support and the second support is suppressed. Therefore, the ability to separate the temperature of the edge ring and the temperature of the substrate from each other is enhanced.

In one exemplary embodiment, a portion of the refrigerant flow path extends around the central axis of the first region to overlap the second region. According to the embodiment, heat conduction between the first support and the second support via the second region of the base is further suppressed. Therefore, the ability to separate the temperature of the edge ring and the temperature of the substrate from each other is further enhanced.

In one exemplary embodiment, the refrigerant flow path may include first to third flow paths. The first flow path extends in the first region. The second flow path extends around the central axis of the first region to overlap the second region. The third flow path extends in the third region and around the central axis. According to the embodiment, heat conduction between the first support and the second support via the second region of the base is further suppressed. Therefore, the ability to separate the temperature of the edge ring and the temperature of the substrate from each other is further enhanced.

In one exemplary embodiment, the second flow path may have an inner edge and an outer edge, the inner edge may extend in the first region and the outer edge may extend in the third region. According to the embodiment, the ability to separate the temperature of the edge ring and the temperature of the substrate from each other is further enhanced.

In one exemplary embodiment, the first flow path, the second flow path, and the third flow path may be in communication with each other.

In one exemplary embodiment, the first flow path and the third flow path may be separated from each other. That is, the first flow path and the third flow path may not be connected to each other. In one exemplary embodiment, the second flow path may be in communication with the first flow path, That is, the second flow path may be connected to the first flow path.

In one exemplary embodiment, the cross-sectional areas of the first flow path and the third flow path may be different from each other.

In one exemplary embodiment, the cross-sectional area of the first flow path may be smaller than the cross-sectional area of the third flow path. According to the embodiment, the cooling capacity of the first region is higher than the cooling capacity of the third region.

In one exemplary embodiment, the second support may have a heater therein.

In one exemplary embodiment, the first support and the second support may be separated from each other to provide a gap between an outer peripheral surface of the first support and an inner peripheral surface of the second support to expose the upper surface of the second region. In one exemplary embodiment, the substrate support may further include a seal member. In the embodiment, the seal member may extend to cover the upper surface of the second region and be disposed or held between the first support and the second support.

In one exemplary embodiment, the first support may include electrostatic chuck.

In one exemplary embodiment, the second support may be formed of a dielectric.

In another exemplary embodiment, a plasma processing apparatus is provided. The plasma processing apparatus includes a chamber and a substrate support. The substrate support is any of the substrate supports of the above-described various exemplary embodiments.

Hereinafter, various exemplary embodiments will be described in detail with reference to the drawings. In the drawing, the same or equivalent portions are denoted by the same reference symbols.

FIG. 1 is a diagram schematically illustrating a plasma processing apparatus according to one exemplary embodiment. The plasma processing apparatus 1 shown in FIG. 1 may be a capacitively coupled plasma processing apparatus. The plasma processing apparatus 1 includes a chamber 10. The chamber 10 provides an internal space 10s therein. The central axis of the internal space 10s is an axis AX extending in the vertical direction.

In one embodiment, chamber 10 includes a chamber body 12. The chamber body 12 has a substantially cylindrical shape. The internal space 10s is provided inside the chamber body 12. The chamber body 12 is formed of, for example, aluminum. The chamber body 12 is electrically grounded. A film having plasma resistance is formed on the inner wall surface of the chamber body 12, that is, the wall surface defining the internal space 10s. This film may be a ceramic film such as a film formed by anodizing or a film formed of yttrium oxide.

A passage 12p is formed in a side wall of the chamber body 12. The substrate W passes through the passage 12p when the substrate W is transferred between the internal space 10s and the outside of the chamber 10. A gate valve 12g is provided along the side wall of the chamber body 12 to open and close the passage 12p.

The plasma processing apparatus 1 further includes a substrate support 14 according to one exemplary embodiment. The substrate support 14 is supported by the support portion 17. The support portion 17 extends upward from the bottom portion of the chamber body 12. The support portion 17 has a substantially cylindrical shape. The support portion 17 is formed of an insulating material such as quartz.

The substrate support 14 has a base 18, a first support 21, and a second support 22. The base 18 is formed of a conductor such as aluminum and has a disk shape. The base 18 constitutes a lower electrode in the plasma processing apparatus 1.

The first support 21 and the second support 22 are mounted on the base 18. The first support 21 is configured to support the substrate W placed thereon. The substrate W has a substantially disc shape. The second support 22 is configured to support the edge ring ER placed thereon. The edge ring ER is a substantially annular plate. The edge ring ER is used to improve the in-plane uniformity of plasma processing on the substrate W. The edge ring ER is formed of for example, silicon, silicon carbide, or quartz. The substrate W is disposed on the first support 21 and in a region surrounded by the edge ring ER. The details of the substrate support 14 will be described later.

The plasma processing apparatus 1 may further include a gas supply line 25. The gas supply line 25 supplies heat transfer gas, for example, He gas, from a gas supply mechanism to a gap between the upper surface of the first support 21 and the back surface (lower surface) of the substrate W.

The plasma processing apparatus 1 may further include an outer peripheral portion 28 and an outer peripheral portion 29. The outer peripheral portion 28 extends upward from the bottom portion of the chamber body 12. The outer peripheral portion 28 has a substantially cylindrical shape and extends along the outer periphery of the support portion 17. The outer peripheral portion 28 is formed of a conductive material and has a substantially cylindrical shape. The outer peripheral portion 28 is electrically grounded. A film having plasma resistance is formed on the surface of the outer peripheral portion 28. This film may be a ceramic film such as a film formed by anodizing or a film formed of yttrium oxide.

The outer peripheral portion 29 is provided on the outer peripheral portion 28. The outer peripheral portion 29 is formed of a material having an insulating property. The outer peripheral portion 29 is formed of, for example, a ceramic such as quartz. The outer peripheral portion 29 has a substantially cylindrical shape. The outer peripheral portion 29 extends along the outer periphery of the substrate support 14.

The plasma processing apparatus 1 further includes an upper electrode 30, The upper electrode 30 is provided above the substrate support 14. The upper electrode 30 together with the member 32 closes the upper opening of the chamber body 12. The member 32 has an insulating property. The upper electrode 30 is supported on the upper part of the chamber body 12 via the member 32.

The upper electrode 30 includes a ceiling plate 34 and a support 36. The lower surface of the ceiling plate 34 defines an internal space 10s. A plurality of gas delivery holes 34a are formed in the ceiling plate 34. Each of the plurality of gas delivery holes 34a penetrates the ceiling plate 34 in the plate thickness direction (vertical direction). The ceiling plate 34 is formed of, for example, hut not limited to, silicon. Alternatively, the ceiling plate 34 may have a structure in which a film having plasma resistance is provided on the surface of a member made of aluminum. This film may be a ceramic film such as a film formed by anodizing or a film formed of yttrium oxide.

The support 36 supports the ceiling plate 34 detachably. The support 36 is formed of a conductive material such as aluminum, for example. Inside the support 36, a gas diffusion chamber 36a is provided. A plurality of gas holes 36b extend downward from the gas diffusion chamber 36a, The plurality of gas holes 36b is in communication with the plurality of gas delivery holes 34a, respectively. The support 36 has a gas introduction port 36c formed therein. The gas introduction port 36c is connected to the gas diffusion chamber 36a. A gas supply pipe 38 is connected to the gas introduction port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 constitute a gas supply unit. The gas source group 40 includes a plurality of gas sources. Each of the valve group 41 and the valve group 43 includes a plurality of valves (for example, open/close valves). The flow rate controller group 42 includes a plurality of flow rate controllers. Each of the plurality of flow rate controllers in the flow rate controller group 42 is a mass flow rate controller or a pressure control type flow rate controller. Each of the plurality of gas sources of the gas source group 40 is connected to the gas supply pipe 38 via a corresponding valve of the valve group 41, a corresponding flow rate controller of the flow rate controller group 42, and a corresponding valve of the valve group 43. The plasma processing apparatus 1 can supply the gas from one or more gas sources selected from among the plurality of gas sources of the gas source group 40 to the internal space 10s at a flow rate individually adjusted.

A baffle plate 48 is provided between the outer peripheral portion 28 and the side wall of the chamber body 12. The baffle plate 48 may be configured by, for example, coating a member made of aluminum with a ceramic such as yttrium oxide. A multiple through holes are formed in the baffle plate 48. Below the baffle plate 48, an exhaust pipe 52 is connected to the bottom of the chamber body 12. An exhaust device 50 is connected to the exhaust pipe 52, The exhaust device 50 has a pressure controller such as an automatic pressure control valve and a vacuum pump such as a turbo molecular pump, and can reduce the pressure in the internal space 10s.

In one embodiment, the plasma processing apparatus 1 may further include a radio frequency power supply 61 and a matcher 61m. The radio frequency power supply 61 is electrically connected to the base 18 via the matcher 61m. The radio frequency power supply 61 is a power supply that generates radio frequency power for plasma generation. The radio frequency power generated by the radio frequency power supply 61 has a frequency within the range of 27 to 100 MHz, for example, a frequency of 40 MHz or 60 MHz. The matcher 61m has a matching circuit for matching the load impedance (base 18 side) of the radio frequency power supply 61 with the output impedance of the radio frequency power supply 61. The radio frequency power supply 61 may not be electrically connected to the base 18 and may be connected to the upper electrode 30 via the matcher 61m.

In one embodiment, the plasma processing apparatus 1 may further include a radio frequency power supply 62 and a matcher 62m. The radio frequency power supply 62 is electrically connected to the base 18 via the matcher 62m. The radio frequency power supply 62 generates radio frequency power for attracting ions to the substrate W from the plasma generated in the chamber 10. The radio frequency power generated by the radio frequency power supply 62 has a frequency lower than the frequency of the radio frequency power generated by the radio frequency power supply 61. The frequency of the radio frequency power generated by the radio frequency power supply 62 is a frequency within the range of 400 kHz to 13.56 MHz, for example, 400 kHz. The matcher 62m has a matching circuit for matching the load impedance (base 18 side) of the radio frequency power supply 62 with the output impedance of the radio frequency power supply 62.

In one embodiment, the plasma processing apparatus 1 may further include a controller MC. The controller MC is a computer including a processor, a storage device, an input device, a display device, and the like, and controls each unit of the plasma processing apparatus 1. Specifically, the controller MC executes a control program stored in the storage device, and controls each unit of the plasma processing apparatus 1 based on the recipe data stored in the storage device. The process designated by the recipe data is executed in the plasma processing apparatus 1 under the control of the controller MC.

Figure 2:
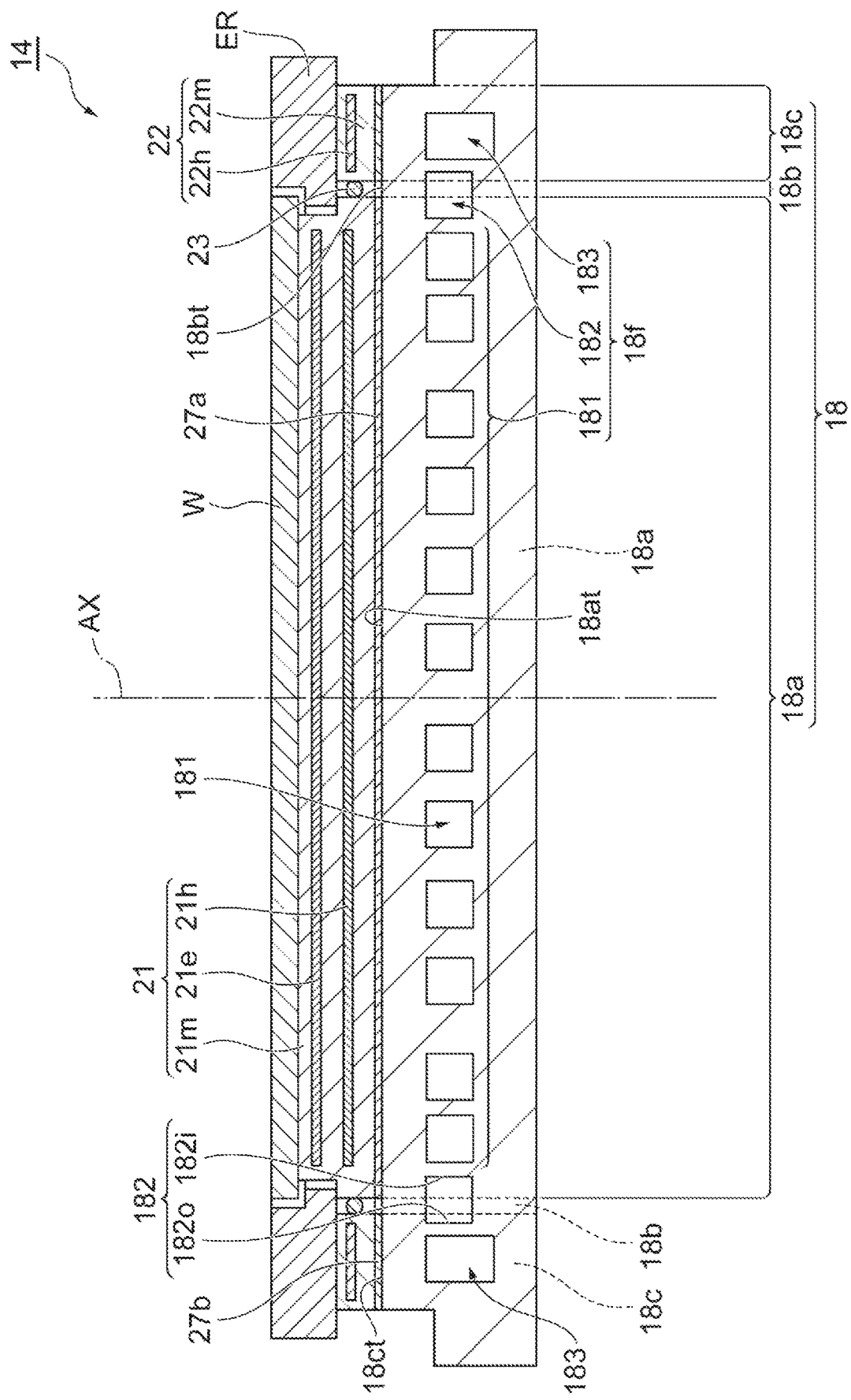
FIG. 2 is a cross-sectional view showing a substrate support according to one exemplary embodiment.
Figure 3:
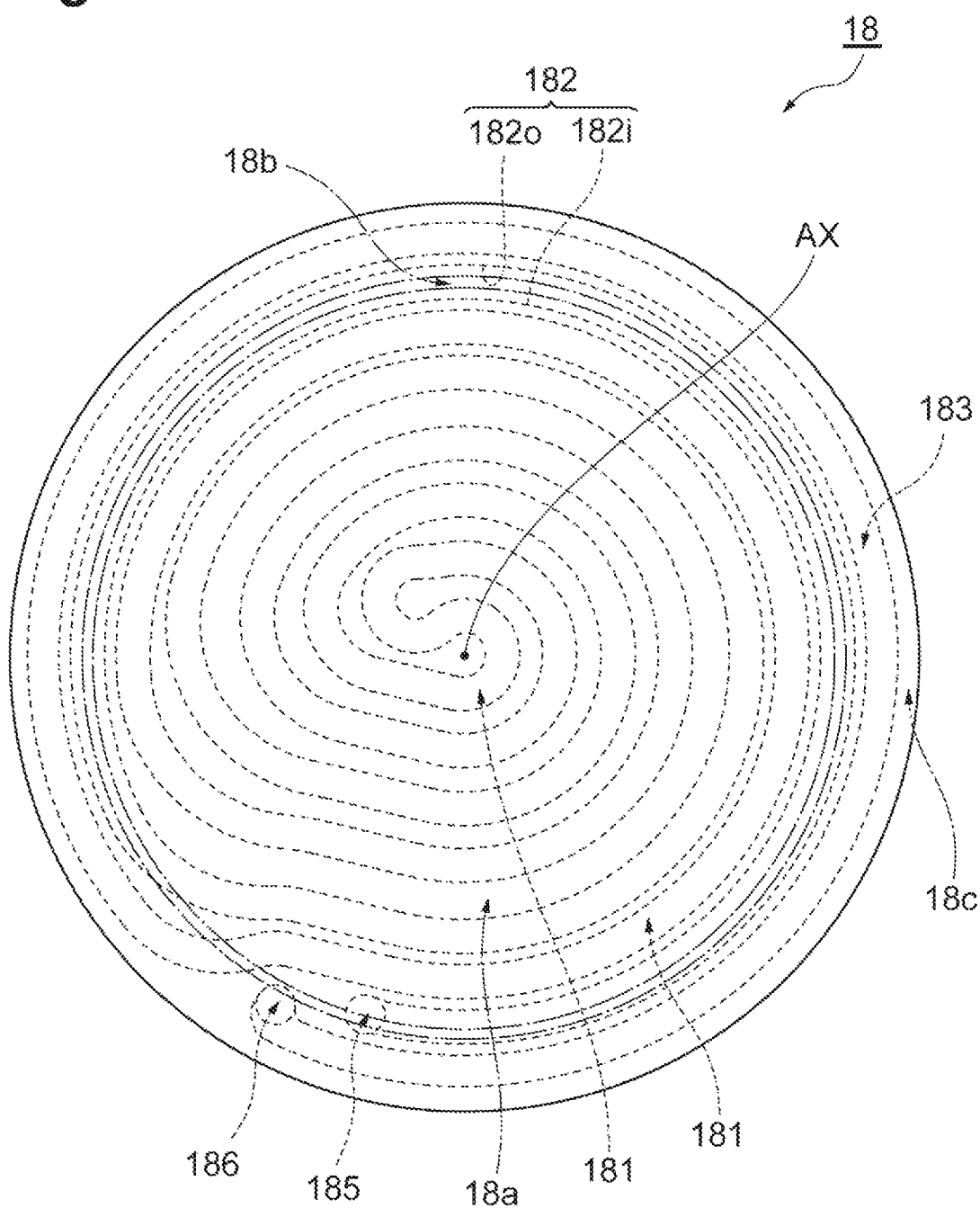
FIG. 3 is a plan view of a base of a substrate support according to one exemplary embodiment.

Hereinafter, the substrate support 14 will be described in detail with reference to FIGS. 2 and 3 together with FIG. 1. FIG. 2 is a cross-sectional view showing a substrate support according to one exemplary embodiment. FIG. 3 is a plan view of a base of a substrate support according to one exemplary embodiment. The substrate support 14 has the base 18, the first support 21, and the second support 22 as described above.

The base 18 is formed of a conductor and has a substantially disc shape, as described above. The base 18 shares the axis AX with the chamber 10 as its central axis. The base 18 includes a first region 18a, a second region 18b, and a third region 18c. In FIG. 2, the boundary between the first region 18a and the second region 18b and the boundary between the second region 18b and the third region 18c are indicated by broken lines. In FIG. 3, the boundary between the first region 18a and the second region 18b and the boundary between the second region 18b and the third region 18c are indicated by alternate long and short dash lines.

The first region 18a is a central region of the base 18. The first region 18a is a region having a substantially disc shape. The first region 18a shares the axis AX with the chamber 10 as its central axis. The first region 18a has a circular upper surface 18at. The upper surface 18at is a flat surface.

The second region 18b extends outside the first region 18a in the radial direction with respect to the axis AX. The second region 18b extends around the axis AX to surround the first region 18a. The second region 18b has an annular upper surface 18bt. The upper surface 18bt extends around the axis AX to surround the upper surface 18at. The upper surface 18bt is a flat surface and is continuous with the upper surface 18at.

The third region 18c extends outward in the radial direction with respect to the second region 18b. The third region 18c extends around the axis AX to surround the second region 18h. The third region 18c has an annular upper surface 18ct. The upper surface 18ct extends around the axis AX to surround the upper surface 18bt. The upper surface 18ct is a flat surface and is continuous with the upper surface 18bt. That is, the upper surface 18at, the upper surface 18bt, and the upper surface 18ct are flat and continuous. In other words, the upper surface 18at, the upper surface 18bt, and the upper surface 18ct form a flat and continuous upper surface of the base 18.

A refrigerant flow path (hereinafter, referred to as "flow path 18f") is formed inside the base 18. The refrigerant is supplied from the refrigerant supply device 24 to the flow path 18f. The supply device 24 is provided outside the chamber 10.

In one embodiment, a part of the flow path 18f extends around the axis AX to overlap the second region 18b. In one embodiment, the flow path 18f includes a first flow path 181, a second flow path 182, and a third flow path 183. The first flow path 181 extends in the first region 18a. The second flow path 182 extends around the axis AX in the base 18 to overlap the second region 18b. The third flow path 183 extends in the third region 18c and around the axis AX.

In one embodiment, the second flow path 182 has an inner edge 182i and an outer edge 182o. The inner edge 182i is an inner edge of the second flow path 182 in the radial direction with respect to the axis AX. The outer edge 182o is an outer edge of the second flow path 182 in the radial direction with respect to the axis AX. In one embodiment, the inner edge 182i extends in the first region 18a. In one embodiment, the outer edge 182o extends in the third region 18c.

In one embodiment, the first flow path 181, the second flow path 182, and the third flow path 183 are in communication with each other. That is, the first flow path 181, the second flow path 182, and the third flow path 183 form a continuous single flow path 18f. In one embodiment, the second flow path 182 and the third flow path 183 are in communication with each other via the first flow path 181. In one embodiment, the flow path 18f has an inlet 185 and an outlet 186. In one embodiment, the inlet 185 is provided at the end of the second flow path 182. In one embodiment, the outlet 186 is provided at the end of the third flow path 183. The inlet 185 and the outlet 186 are connected to the supply device 24. The refrigerant from the supply device 24 is supplied from the inlet 185 to the flow path 18f. The refrigerant supplied to the flow path 18f is returned to the supply device 24 from the outlet 186.

In one embodiment, the cross-sectional area of the first flow path 181 and the cross-sectional area of the third flow path 183 may be different from each other. In one embodiment, the cross-sectional area of the first flow path 181 may be smaller than the cross-sectional area of the third flow path 183. When the cross-sectional area of the first flow path 181 is smaller than the cross-sectional area of the third flow path 183, the flow velocity of the refrigerant in the first flow path 181 is higher than the flow velocity of the refrigerant in the third flow path 183. Therefore, in a case where the cross-sectional area of the first flow path 181 is smaller than the cross-sectional area of the third flow path 183, the cooling capacity of the first region 18a becomes higher than the cooling capacity of the third region 18c. Alternatively, the cross-sectional area of the first flow path 181 may be larger than the cross-sectional area of the third flow path 183. The cross-sectional area of the second flow path 182 may be the same as or different from the cross-sectional area of the first flow path 181.

The first support 21 is mounted on the first region 18a of the base 18. In one embodiment, the first support 21 is bonded to the upper surface 18at of the first region 18a. In one embodiment, the first support 21 is bonded to the upper surface 18at of the first region 18a via the adhesive 27a.

The first support 21 is configured to support the substrate W placed thereon. In one embodiment, the first support 21 may be an electrostatic chuck. In the embodiment, the first support 21 may have a body 21m and an electrode 21e. The body 21m may have a substantially disc shape. The body 21m is formed of a dielectric material such as aluminum nitride or aluminum oxide. The electrode 21e is provided in the body 21m. The electrode 21e is a film-shaped electrode. A DC power supply is connected to the electrode 21e via a switch. When a voltage from a DC power supply is applied to the electrode 21e, an electrostatic attractive force is generated between the first support 21 and the substrate W. The substrate W is attracted to the first support 21 by the generated electrostatic attraction, and is held by the first support 21.

In one embodiment, the first support 21 may further include a heater 21h. The heater 21h is provided in the body 21m. The heater 21h may be a resistance heating element. Electrical power is supplied to the heater 21h from the heater controller HC. The heater controller HC can control the temperature of the substrate W by adjusting the amount of electrical power supplied to the heater 21h.

The second support 22 is provided on the third region 18c of the base 18 to surround the first support 21. In one embodiment, the second support 22 is bonded to the upper surface 18ct of the third region 18c. In one embodiment, the second support 22 is bonded to the upper surface 18ct of the third region 18c via the adhesive 27b.

The second support 22 is configured to support the edge ring ER placed thereon. In one embodiment, the second support 22 has a body 22m formed of a dielectric. The body 22m has a substantially annular and plate shape.

In one embodiment, the second support 22 may further include a heater 22h. The heater 22h is provided in the body 22m. The heater 22h may be a resistance heating element. Electrical power is supplied to the heater 22h from the heater controller HC. The heater controller HC can control the temperature of the edge ring ER by adjusting the amount of electrical power supplied to the heater 22h. The heater 22h may be supplied with electrical power from a heater controller other than the heater controller HC.

The second support 22 is separated from the first support 21. Specifically, the first support 21 and the second support 22 are separated from each other such that a gap is provided between an outer peripheral surface of the first support 21 (or the body 21m) and an inner peripheral surface of the second support 22 (or the body 22m) to expose the upper surface 18bt of the second region 18b.

In one embodiment, the substrate support 14 may further include a seal member 23. The seal member 23 extends to cover the upper surface 18bt of the second region 18b. The seal member 23 is disposed or held between the outer peripheral surface of the first support 21 (or the body 21m) and the inner peripheral surface of the second support 22 (or the body 22m). The seal member 23 has elasticity and plasma resistance. The seal member 23 protects the second region 18b of the base 18 from plasma.

In the substrate support 14, since the first support 21 and the second support 22 are separated from each other, heat conduction between the first support 21 and the second support 22 is suppressed. Therefore, the ability to separate the temperature of the edge ring ER and the temperature of the substrate W from each other is enhanced.

In one embodiment, a portion of the flow path 18f, for example, the second flow path 182, extends around the axis AX to overlap the second region 18b, as described above. With this configuration, heat conduction between the first support 21 and the second support 22 via the second region 18b of the base 18 is further suppressed. Therefore, the ability to separate the temperature of the edge ring ER and the temperature of the substrate W from each other is further enhanced.

In one embodiment, the inner edge 182i of the second flow path 182 extends in the first region 18a and the outer edge 182o of the second flow path 182 extends in the third region 18c. This configuration further enhances the ability to separate the temperature of the edge ring and the temperature of the substrate from each other.

Figure 4:
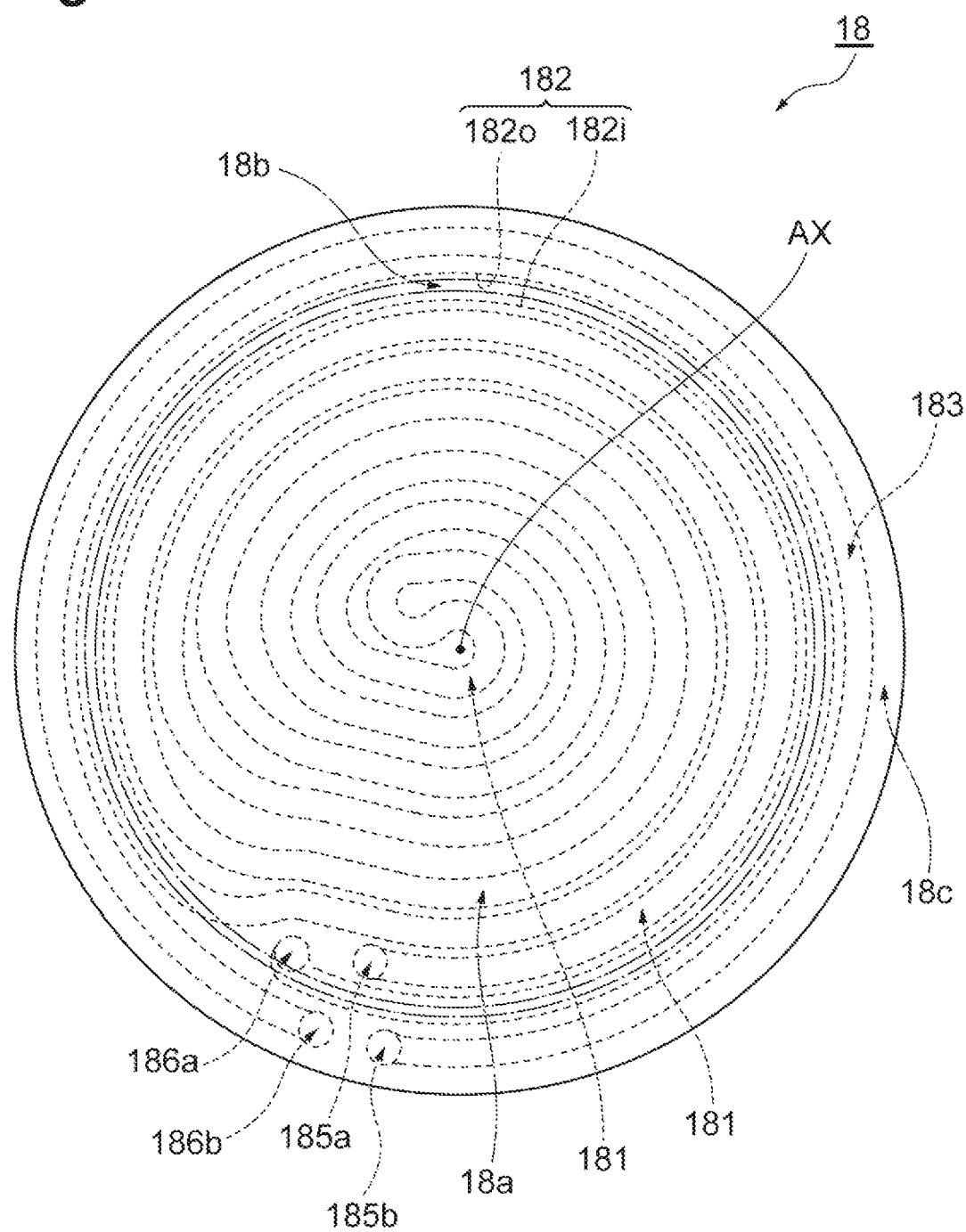
FIG. 4 is a plan view of a base of a substrate support according to another exemplary embodiment.

Hereinafter, a base of a substrate support according to another exemplary embodiment will be described with reference to FIG. 4. FIG. 4 is a plan view of a base of a substrate support according to another exemplary embodiment. Further, in FIG. 4, as in FIG. 3, the boundary between the first region 18a and the second region 18b and the boundary between the second region 18b and the third region 18c are indicated by alternate long and short dash lines.

The base 18 shown in FIG. 4 can be used as the base of the substrate support 14 instead of the base shown in FIG. 3. The base 18 shown in FIG. 4 differs from the base shown in FIG. 3 only in that the refrigerant flow paths are configured with two flow paths separated from each other. The substrate support 14 including the base 18 shown in FIG. 4 has the same configuration as the substrate support 14 including the base shown in FIG. 3 in other points. The differences between the base 18 shown in FIG. 4 and the base shown in FIG. 3 will be described below.

In the refrigerant flow path of the base 18 shown in FIG. 4, the first flow path 181 and the third flow path 183 are separated from each other. That is, the first flow path 181 and the third flow path 183 are not connected to each other. In one embodiment, the second flow path 182 is in communication with the first flow path 181.

The refrigerant flow path of the base 18 shown in FIG. 4 has an inlet 185a, an outlet 186a, an inlet 185b, and an outlet 186b. The inlet 185a is provided at the end of the first flow path 181. The outlet 186a is provided at the end of the second flow path 182. The inlet 185a and the outlet 186a are connected to the supply device 24. The refrigerant from the supply device 24 is supplied to the first flow path 181 from the inlet 185a, passes from the first flow path 181 to the second flow path 182, and is returned to the supply device 24 from the outlet 186a.

The inlet 185b and the outlet 186b are respectively provided at both ends of the third flow path 183. The inlet 185b and the outlet 186b are connected to the supply device 24 or another supply device of the refrigerant. Refrigerant from the supply device 24 or another supply device is supplied to the third flow path 183 from the inlet 185b and returned to the supply device 24 or another supply device from the outlet 186b.

While various exemplary embodiments have been described above, various additions, omissions, substitutions and changes may be made without being limited to the exemplary embodiments described above. Elements of the different embodiments may be combined to form another embodiment.

For example, the outer edge 182o of the second flow path 182 may extend in the first region 18a. In this case, the outer edge 182o may extend within a distance range of about several mm such as 3 mm from the boundary between the first region 18a and the second region 18b.

Further, the plasma processing apparatus including the substrate support 14 is not limited to the capacitively coupled plasma processing apparatus, and may be another type of plasma processing apparatus. For example, the plasma processing apparatus including the substrate support 14 may be an inductively coupled plasma processing apparatus or a plasma processing apparatus that generates plasma by using surface waves such as microwaves.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims

What is claimed is:

1. A substrate support comprising:
   a base with a refrigerant flow path formed therein, the base having a first region having a circular upper surface, a second region extending outward from the first region in a radial direction and surrounding the first region, and a third region extending outward from the second region in the radial direction and surrounding the second region, and the upper surface of the first region, an upper surface of the second region, and an upper surface of the third region being flat and continuous;
   a first support provided on the first region and configured to support a substrate placed thereon; and
   a second support provided on the third region to surround the first support, configured to support an edge ring placed thereon, and separated from the first support,
   wherein the refrigerant flow path has a first flow path extending in the first region, a second flow path extending around a central axis of the first region to overlap the second region, and a third flow path, which is different from the second flow path, extending in the third region and around the central axis, and
   a cross-sectional area of the third flow path is larger than a cross-sectional area of the first flow path and a cross-sectional area of the second flow path.

2. The substrate support according to claim 1, wherein a part of the refrigerant flow path extends around a central axis of the first region to overlap the second region.

3. The substrate support of claim 1, wherein the second flow path has an inner edge and an outer edge, the inner edge extends in the first region, and the outer edge extends in the third region.

4. The substrate support according to claim 1, wherein the first flow path and the third flow path are separated from each other, and the first flow path does not communicate with the third flow path.

5. The substrate support according to claim 4, wherein the second flow path is in communication with the first flow path.

6. The substrate support according to claim 1, wherein the second support has a heater therein.

7. The substrate support according to claim 1, wherein the first support and the second support are separated from each other to provide a gap between an outer peripheral surface of the first support and an inner peripheral surface of the second support to expose the upper surface of the second region.

8. The substrate support according to claim 7, further comprising a seal that extends to cover the upper surface of the second region and is disposed between the first support and the second support.

9. The substrate support according to claim 1, wherein the first support includes an electrostatic chuck.

10. The substrate support according to claim 1, wherein the second support is formed of a dielectric material.

11. An apparatus for plasma processing comprising:
    a chamber; and
    a substrate support provided in the chamber,
    wherein the substrate support includes:
       a base with a refrigerant flow path formed therein, the base having a first region having a circular upper surface, a second region extending outward from the first region in a radial direction and surrounding the first region, and a third region extending outward from the second region in the radial direction and surrounding the second region, and the upper surface of the first region, an upper surface of the second region, and an upper surface of the third region being flat and continuous;
a first support provided on the first region and configured to support a substrate placed thereon; and
a second support provided on the third region to surround the first support, configured to support an edge ring placed thereon, and separated from the first support,
wherein the refrigerant flow path has a first flow path extending in the first region, a second flow path extending around a central axis of the first region to overlap the second region, and a third flow path, which is different from the second flow path, extending in the third region and around the central axis, and
a cross-sectional area of the third flow path is larger than a cross-sectional area of the first flow path and a cross-sectional area of the second flow path.

12. The apparatus for plasma processing according to claim 11, wherein the first flow path and the third flow path are separated from each other, and the first flow path does not communicate with the third flow path.

* * * * *